United States Patent [19]
Kim

[11] Patent Number: 5,994,200
[45] Date of Patent: Nov. 30, 1999

[54] TRENCH ISOLATION STRUCTURE OF A SEMICONDUCTOR DEVICE AND A METHOD FOR THEREOF

[75] Inventor: Young-Gwan Kim, Cheongju-si, Rep. of Korea

[73] Assignee: LG Semicon Co., Ltd., Chungcheongbuk-do, Rep. of Korea

[21] Appl. No.: 08/898,574

[22] Filed: Jul. 22, 1997

[30] Foreign Application Priority Data

Dec. 26, 1996 [KR] Rep. of Korea ........................ 96-72490

[51] Int. Cl.⁶ ...................................................... H01L 21/76
[52] U.S. Cl. .......................... 438/425; 438/424; 438/426; 438/435; 438/444; 148/DIG. 50
[58] Field of Search ..................................... 438/425, 426, 438/424, 427, 435, 444, 524, 526; 148/DIG. 50

[56] References Cited

U.S. PATENT DOCUMENTS

| | | |
|---|---|---|
| 4,566,172 | 1/1986 | Bencuya ................................. 438/524 |
| 4,842,675 | 6/1989 | Chapman et al. ................ 148/DIG. 50 |
| 4,968,636 | 11/1990 | Sugawara ................................. 438/423 |
| 5,099,304 | 3/1992 | Takemura et al. . |
| 5,393,693 | 2/1995 | Ko et al. ................................... 438/297 |
| 5,445,989 | 8/1995 | Lur et al. ................................. 438/425 |
| 5,686,344 | 11/1997 | Lee ................................... 148/DIG. 50 |
| 5,783,476 | 7/1998 | Arnold .................................... 438/425 |
| 5,807,784 | 9/1998 | Kim ........................................ 438/425 |

Primary Examiner—Trung Dang

[57] ABSTRACT

A semiconductor device isolation structure includes a trench formed in a substrate vertically from the major surface of the substrate, a trench plug for filling the trench, and a buried insulation region formed under the trench adjacent thereto, and a method of the same includes the steps of forming a trench in a substrate and vertically from the major surface of the substrate, selectively implanting oxide ions under the trench of the substrate, and forming a trench plug so as to fill the trench.

20 Claims, 5 Drawing Sheets

TRENCH ISOLATION STRUCTURE OF A SEMICONDUCTOR DEVICE AND A METHOD FOR THEREOF

BACKGROUND OF THE INVENTION

1. Field of the Invention

The present invention relates to a semiconductor device isolation structure and its fabricating method and, more particularly, to a semiconductor device isolation structure which is suitable for a high-density integrated circuit, and its fabricating method.

2. Discussion of Related Art

As a semiconductor device gets highly integrated, it is required to reduce the size of a device isolation region. In general, semiconductor devices are isolated with a trench isolation structure which can be prepared in a manner that a trench is formed in a designated portion and then filled with trench-filling material such as an insulating material. With the high integration of a semiconductor device, however, the above-described conventional semiconductor device isolation structure and its fabricating method involve some problems in that the trench cannot be completely filled with the trench-filling material and a void is generated in the trench according to the increase in the aspect ratio of the trench.

FIGS. 1a, 1b and 1c are flow diagrams illustrating the trench isolation structure and its fabricating method in accordance with an example of the prior art.

The conventional trench isolation structure in FIG. 1c comprises a substrate 11, a trench formed as deep as desired, and a trench plug 18' which is an insulating material of one or more kinds.

Referring to FIG. 1a, after the trench is formed in the substrate 11, there are sequentially formed a silicon oxide layer 171, a silicon nitride layer 172 and a BPSG (Boron Phospho Silicate Glass) layer 18. In this structure, the BPSG layer 18 may have a void 20 due to a high aspect ratio. Therefore, a heat treatment is carried out on the BPSG layer 18 so as to reflow it, as shown in FIG. 1b. Then, as shown in FIG. 1c, the trench plug 18' is formed by an etch-back on the BPSG layer 18. The reference numeral 12 of FIGS. 1a, 1b and 1c depicts a silicon oxide layer which is a part of a mask layer used in the process for forming the trench.

The above-described conventional trench isolation structure has some advantages in that a heat treatment is needed for reflowing the BPSG layer 18 because the void 20 is generated and, as illustrated in FIGS. 1b and 1c, the surface of the BPSG layer 18 is not uniform after it reflows.

FIGS. 2a through 2d are flow diagrams illustrating the trench isolation structure and its fabricating method in accordance with another example of the prior art.

As shown in FIG. 2d, the trench isolation structure disclosed in U.S. Pat. No. 5,099,304 comprises a substrate 21, a trench formed in the substrate 21, and a trench-filling material layer which includes a first trench-filling material layer 281' of polysilicon and a second trench-filling material layer 282' of BPSG.

Referring to FIG. 2a, after the trench is formed in the substrate 21, there are sequentially formed a silicon oxide layer 271 and a silicon nitride layer 272. Then, a polysilicon layer 281 is deposited on the above structure so as to fill the trench.

Referring to FIG. 2b, an etch-back is performed on the polysilicon layer 281 so that the first trench-filling material layer 281' is remained and fills a part of the trench. Then, as shown in FIG. 2c, a BPSG layer 282 is formed on the entire surface of the structure so as to fill the rest part of the trench which is filled with the first trench-filling material layer 281'.

In the next, as shown in FIG. 2d, a selective etching is carried out on the BPSG layer 282 so as to remove all portions except the trench and thereby form the second trench-filling material layer 282' that completely fills the rest part of the trench. After that, there is formed a silicon oxide layer 29 covering the silicon nitride layer 272 and the second trench-filling material layer 282'. The reference numeral 22 of FIGS. 2a through 2d depicts a silicon oxide layer which is a part of a mask layer used in forming the trench.

However, the device isolation structure disclosed in U.S. Pat. No. 5,099,304 involves a problem in that an additional process for forming another filling material layer must be carried out so as to fill the trench. Further, BPSG requiring a heat treatment for a reflow is used as a trench-filling material in the prior art. Therefore, for a second generation's highly integrated circuit that requires a low heat cycle, the BPSG used as a trench-filling material has a fatal disadvantage in that it is difficult to meet the conditions for an ion-implantation to form a junction.

SUMMARY OF THE INVENTION

Accordingly, the present invention is directed to a semiconductor device isolation structure and its fabricating method that substantially obviates one or more of the problems due to limitations and disadvantages of the related art.

An object of the present invention is to provide a semiconductor device isolation structure which is suitable for a high-density integrated circuit due to a buried insulation region formed under a trench, and its fabricating method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device isolation structure includes a trench formed in a substrate vertically from the major surface thereof, a trench plug for filling the trench, and a buried insulation region formed under the trench adjacent thereto. Further, the method of fabricating the semiconductor device isolation structure includes the steps of forming a trench in a substrate vertically from the major surface thereof, selectively implanting oxide ions under the trench of the substrate, and forming a trench plug so as to fill the trench.

It is to be understood that both the foregoing general description and the following detailed description are exemplary and explanatory and are intended to provide further explanation of the invention as claimed.

In another aspect, the present invention provides a semiconductor device isolation structure with a trench having an adequate aspect ratio so as to prevent the generation of a void while the trench is filled with a trench-filling material. Also, the present invention is suitable for a highly integrated circuit that absolutely requires the lateral area of the isolation region to be decreased. Furthermore, the method of the present invention provides the isolation structure of desired depth without additional process for forming a mask, compared with the prior art.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1A:
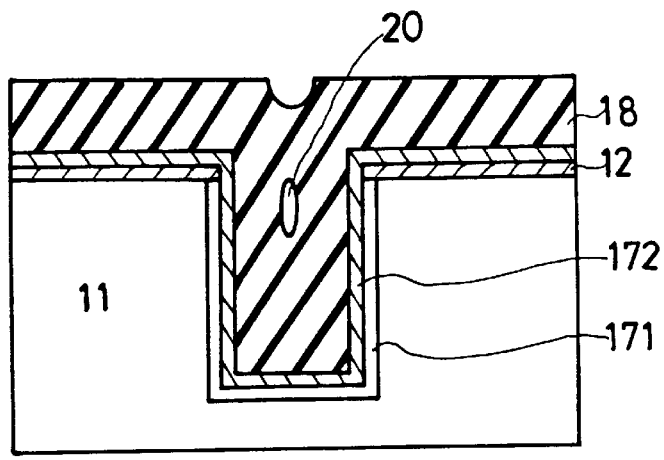
FIGS. 1a, 1b and 1c are flow diagrams illustrating the trench isolation structure and its fabricating method in accordance with an example of the prior art.
Figure 1B:
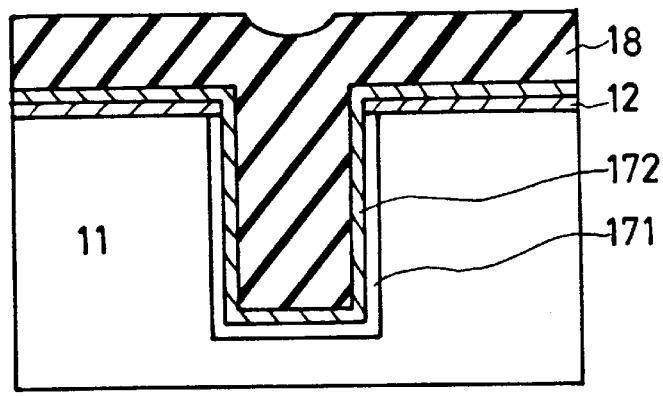
Figure 1C:
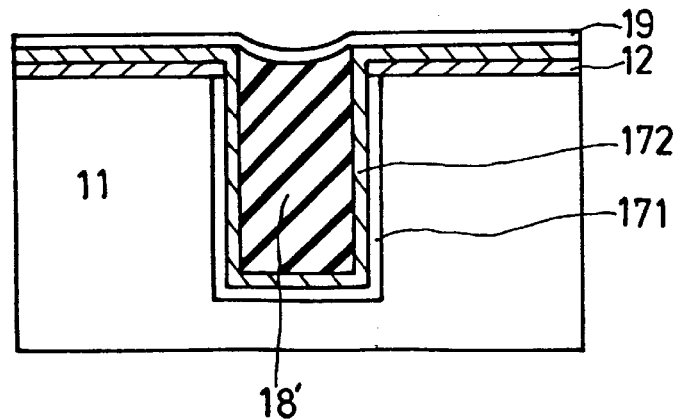
Figure 2A:
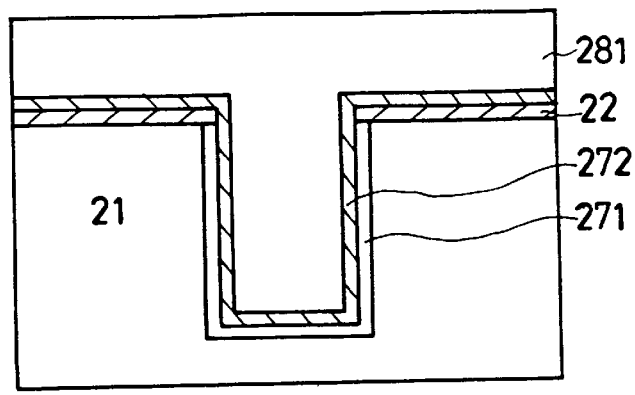
FIGS. 2a through 2d are flow diagrams illustrating the trench isolation structure and its fabricating method in accordance with another example of the prior art.
Figure 2B:
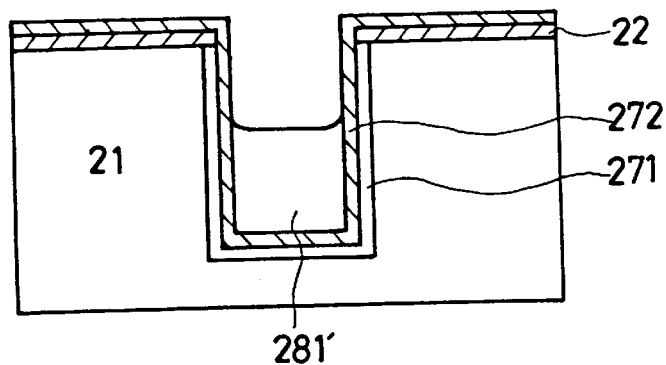
Figure 2C:
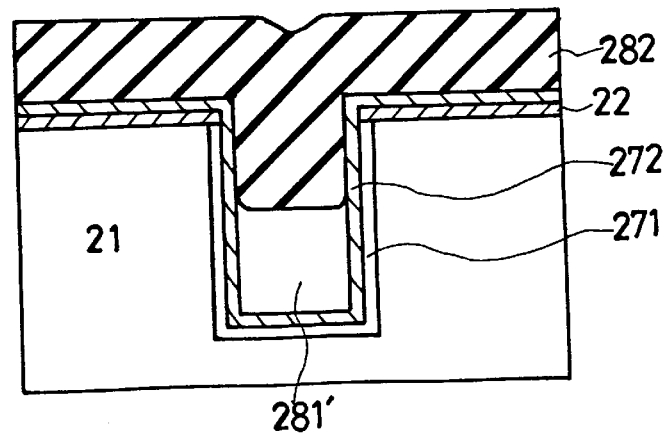
Figure 2D:
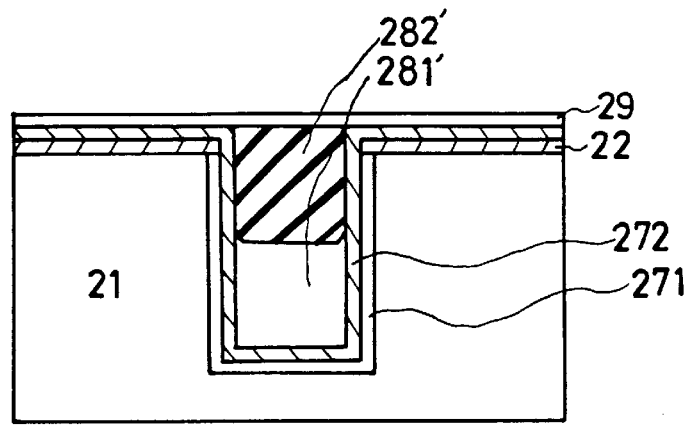
Figure 3:
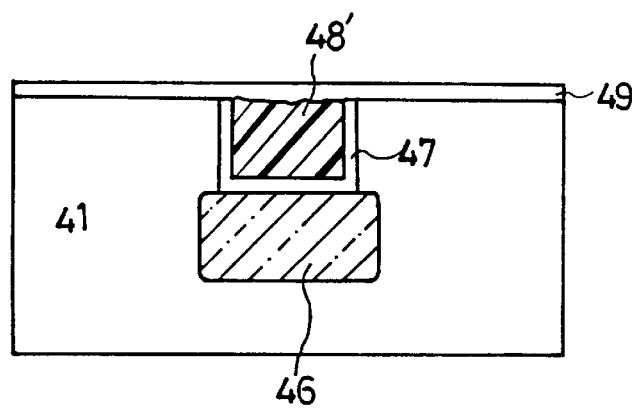
FIG. 3 is a cross-sectional view showing the isolation structure of a semiconductor device in accordance with a preferred embodiment of the present invention.

FIG. 3 is a cross-sectional view showing the isolation structure of a semiconductor device in accordance with a preferred embodiment of the present invention.

As shown in FIG. 3, a trench is formed vertically from a major surface of the semiconductor substrate 41. Silicon is used for the substrate 41. The trench is formed with an adequate aspect ratio. In other words, it is not as deep as the desired isolation structure.

On the inner surface of the trench, there is formed a trench liner 47. A silicon oxide layer formed by thermal oxidation is preferable for the trench liner 47. A silicon oxide layer formed with CVD (Chemical Vapor Deposition) also can be used for forming trench line 47. Additionally, for the trench liner 47, there can be employed a silicon nitride layer, a laminated layer of the silicon nitride layer and the silicon oxide layer, and a silicon oxynitride layer.

The trench is substantially and completely filled with a trench plug 48' which is a silicon oxide layer formed from TEOS (Tetra Ethlyl Ortho Silicate) as a filling material and which is located adjacent to the trench liner 47. There also can be employed polysilicon, spin-on-glass and BPSG for the trench plug 48'.

A buried insulation region 46 is formed adjacent to and at the bottom of the trench. It is a silicon oxide layer formed from implanted oxide ions during a thermal process.

The reference numeral 49 of FIG. 3 depicts a gate insulating layer.

FIGS. 4a through 4f are flow diagrams illustrating the method of fabricating the isolation structure of a semiconductor device in accordance with a preferred embodiment of the present invention.

Figure 4A:
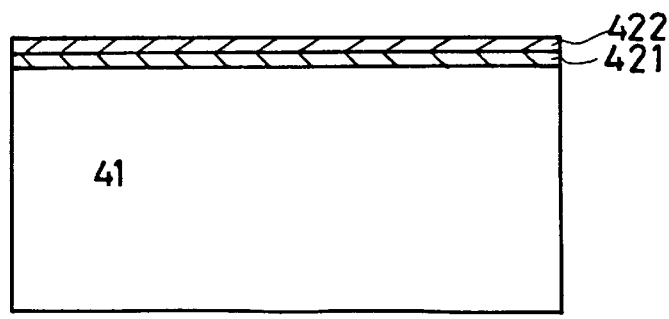
FIGS. 4a through 4f are flow diagrams illustrating the method of fabricating the isolation structure of a semiconductor device in accordance with a preferred embodiment of the present invention.

As shown in FIG. 4A, there are sequentially deposited a buffer film 421 which is a thermal oxide layer, and a silicon nitride layer 422 on the major surface of the substrate 41. The silicon nitride layer 422 is formed with CVD.

Figure 4B:
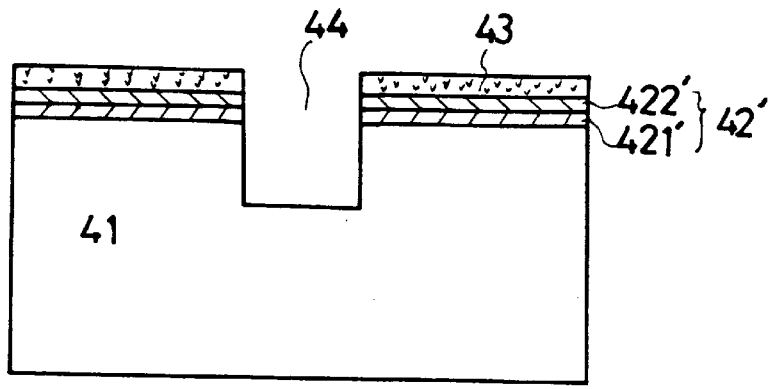

Referring to FIG. 4B, a part of the buffer film 421 and silicon nitride layer 422 is selectively removed so as to expose a designated portion of the substrate 41. Thus, there is formed an ion-implantation mask 42' including the buffer film 421' and the silicon nitride layer 422' by forming a photoresist 43 on the silicon nitride layer 422 and then etching the silicon nitride layer 422 and the buffer film 421. In the next, the exposed portion of the substrate 41 is etched so as to form a trench 44 in the substrate. The trench is formed with an adequate aspect ratio so that it is not as deep as a desired isolation structure, which makes it easier to fill it with a filling material. An anisotropic etching with plasma etching gas is preferably used for forming the trench 44. After the trench is formed, photoresist 43 is removed.

Figure 4C:
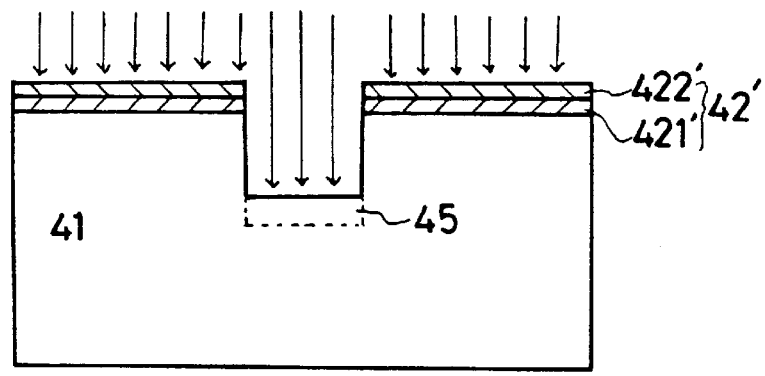

Referring to FIG. 4C, oxygen ions are implanted into the substrate 41 under the trench 44. In this process, the ion-implantation mask layer 42' blocks the ion-implantation on the major surface of the substrate 41 other than the trench 44. The reference numeral of 45 depicts as ion-implanted area of the substrate.

Figure 4D:
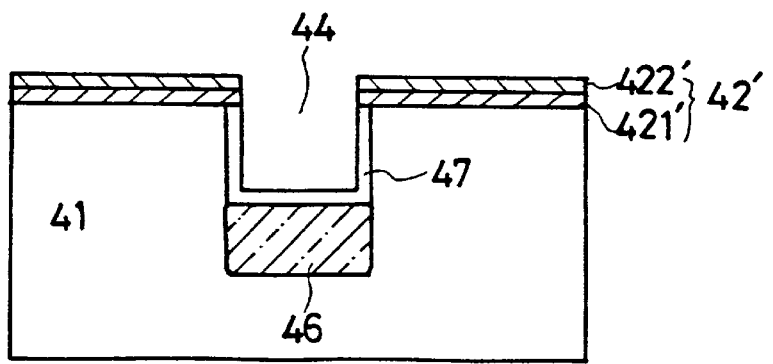

As shown in FIG. 4D, a thermal oxidation is carried out to form the trench liner 47 on the inner surface of the trench. In the process, the silicon nitride layer 422' of the ion-implantation mask layer 42' serves as an anti-oxidation layer. For the trench liner 47 which is to remove the etching damage during the formation of the trench, there can be employed a silicon oxide layer or a silicon oxynitride layer formed with CVD as well as a thermal oxide layer. In particular, as shown in FIG. 4D, it is desirable to deposit the trench liner 47 with thermal oxidation, where a silicon oxide layer, that is, the buried insulating layer 46 is formed in the oxide ion-implanted portion under the trench without separate thermal process for forming the buried insulating layer 46.

Figure 4E:
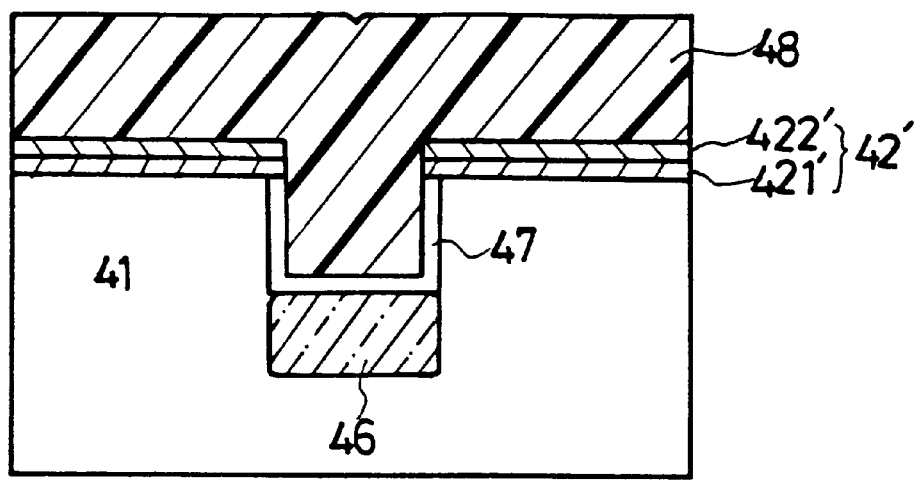
Figure 4F:
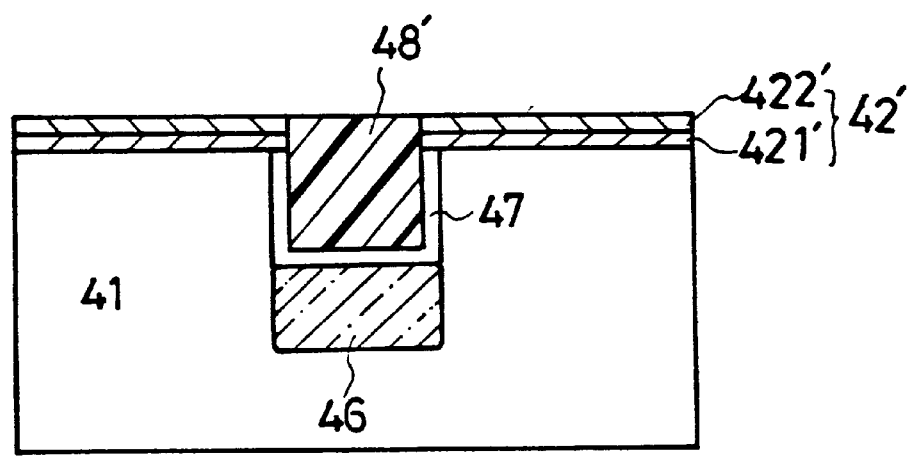

FIGS. 4E and 4F illustrate the process for forming the trench plug to fill the trench. As shown in FIG. 4E a silicon oxide layer is formed on the entire surface of the ion-implantation mask layer 42', including the trench, by using TEOS (Tetra Ethyl Ortho Silicate) as a trench-filling material. In the process, the trench can be filled with the trench-filling material without void due to its adequate aspect ratio according to the present invention. Further, there can be employed polysilicon, spin-on-glass or BPSG as the trench-filling material.

Referring to FIG. 4F, CMP (Chemical Mechanical Polishing) is carried out as a selective etching process for the trench-filling material layer so as to form the trench plug 48'. In the process, the ion-implantation mask layer 42' serves as an etch-preventing layer. This etching process can be a dry etching using a plasma etching gas.

The present invention is not limited to the above-described preferred embodiment. Therefore, the trench liner can include a multitude of layers, and the order of the trench liner formation and the oxide ion-implantation can be switched in the process.

It will be apparent to those skilled in the art that various modifications and variations can be made in a semiconductor device isolation structure and its fabricating method according to the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device having a trench isolation structure, comprising:
   providing a substrate;
   forming a trench in said substrate;

forming a first isolation region beneath said trench;

forming a second and distinct isolation region into said trench; and forming a trench liner on a surface of the trench, wherein the first and second isolation regions are separated by the trench liner.

2. The method of claim 1, wherein the step of forming said first isolation region comprises:

implanting ions beneath said trench; and annealing said implanted ions.

3. The method of claim 2, wherein said ions include oxygen.

4. The method of claim 1, wherein said second isolation region is formed by depositing an insulating material.

5. The method of claim 4, wherein said insulating material includes a tetraethylortho silicate(TEOS).

6. A method of fabricating a semiconductor device having a trench isolation structure, comprising:

providing a substrate;

forming a mask layer on said substrate;

selectively removing a portion of said mask layer to expose said substrate;

forming a trench in said exposed substrate using said mask layer as a mask;

implanting ions beneath said trench;

annealing said implanted ions for form a first isolation region;

forming an insulating layer into said trench to form a second and distinct isolation region; and forming a trench liner on a surface of the trench, wherein the first and second insulation regions are separated by the trench liner.

7. The method of claim 6, wherein said mask layer is made of a buffer oxide layer and nitride layer.

8. The method of claim 6, wherein said trench is formed by anisotropically etching said exposed substrate.

9. The method of claim 6, wherein said ions include oxygen.

10. The method of claim 6, wherein the steps of forming an insulating layer comprises:

depositing a trench-filling material layer on said trench and said mask layer; and selectively removing said trench-filling material layer to expose said mask layer.

11. The method of claim 10, wherein said trench-filling material layer includes a tetraethylortho silicate(TEOS).

12. The method of claim 10, wherein said selectively removing of said trench-filling material layer is a plasma etching or a chemical mechanical polishing(CMP).

13. A method of fabricating a trench isolation structure within a semiconductor device, comprising:

forming a first isolating layer under a trench within a substrate via an ion implantation process;

forming a trench liner on a surface of the trench; and forming a second isolating layer within the trench via a deposition process, where the first and second isolating layers are separated by the trench liner.

14. The method of claim 13, where forming the first isolation layer includes:

implanting ions into a portion of the substrate located under the trench;

oxidizing the ion-implanted portion of the substrate before forming the second isolating layer.

15. The method of claim 13, where forming the second isolation layer includes:

depositing a trench-filling material on the semiconductor device;

selectively removing the trench-filling material to expose portions of the semiconductor device other than the trench.

16. The method of claim 13, where the trench liner is formed by thermal oxidation of a silicon oxide layer.

17. The method of claim 13, where the trench liner is formed by chemical vapor deposition of a silicon oxide layer.

18. The method of claim 13, where the trench liner is formed of a silicon nitride layer.

19. The method of claim 13, where the trench liner is formed of a laminated layer of silicon nitride and silicon oxide.

20. The method of claim 13, where the trench liner is formed of a silicon oxynitride layer.

* * * * *